United States Patent [19]

Bauman

[11] 4,394,624
[45] Jul. 19, 1983

[54] CHANNELIZED FEED-FORWARD SYSTEM

[75] Inventor: Ronald M. Bauman, Washington, D.C.

[73] Assignee: The United States of America as represented by the Secretary of the Navy, Washington, D.C.

[21] Appl. No.: 290,760

[22] Filed: Aug. 7, 1981

[51] Int. Cl.³ .............................................. H03F 1/26
[52] U.S. Cl. ................................... 330/151; 330/149
[58] Field of Search ............................... 330/149, 151

[56] References Cited

U.S. PATENT DOCUMENTS

| | | | |
|---|---|---|---|
| 3,471,798 | 10/1969 | Seidel | 330/149 |
| 3,541,467 | 11/1970 | Seidel | 330/149 |
| 3,667,065 | 5/1972 | Beurrier et al. | 330/149 |

OTHER PUBLICATIONS

Meyer, R. et al., A Wide-Band Feed Forward Amplifier, IEEE Journal of Solid State Circuits, vol. SC9, No. 6, Dec. 1974, pp. 422–428.

Primary Examiner—James B. Mullins
Assistant Examiner—Gene Wan
Attorney, Agent, or Firm—Robert F. Beers; William T. Ellis; Alan P. Klein

[57] ABSTRACT

A feed-forward system for reducing the distortion products from a device such as an amplifier, wherein samples of the distortion products from the output of the device in one or more frequency bands whose bandwidths are less than that of the device are extracted, adjusted in amplitude and phase and subtractively combined with the device output to produce a system output in which distortion in the frequency bands is reduced.

23 Claims, 6 Drawing Figures

CHANNELIZED FEED-FORWARD SYSTEM

BACKGROUND OF THE INVENTION

This invention relates generally to feed-forward systems used to reduce distortion products in electrical devices such as amplifiers.

The term "distortion" as used herein shall be understood to include any signals present in the output of the electrical device which were not present in the input such as hum, noise, harmonic distortion, intermodulation distortion, etc.

In shipboard or ground-based high frequency communication systems, the receiving and transmitting antennas are often located close to each other. The receivers must operate at maximum sensitivity while the transmitters are transmitting. The amplifiers in the transmitters generate distortion products which are radiated from the transmitting antennas with the high power signals. These distortion products can fill the high frequency band with interference and adversely affect operation of close-by and remote receivers.

Feed-forward cancelling systems are known for reducing the distortion products generated in amplifiers. In the conventional adaptive feed-forward cancelling system, for example, samples of the input and output signals of a device such as a quasi-linear amplifier are adjusted in amplitude and phase and subtractively combined in a first combiner to produce a sample of the distortion products present in the output from the device. This distortion sample is adjusted in amplitude and phase and fed forward to a second combiner where it is subtractively combined with the output from the device to cancel the remaining distortion products therein. Typically, the distortion sample is adjusted in amplitude and phase by passing it through an amplitude-and-phase modulator followed by a subsidiary amplifier. Uncontrolled component variations such as drift can necessitate changes in the amplitude and phase settings of the modulator. To maintain the cancellation, a control means such as a synchronous detector correlates a sample of the feed-forward system output with the distortion sample and adaptively adjusts the modulator to minimize the correlation result. If D denotes the power level of the distortion component and S denotes the power level of the fundamental component (input signal replica) in the output signal from the device, and if the first combiner rejects the fundamental component relative to the distortion component by a power ratio $R_1$, the second combiner rejects the distortion component relative to the fundamental component by a power ratio of $$R_2 = D^2 R_1 / S^2.$$

The performance of this conventional adaptive feed-forward system suffers from the following disadvantage so far as its application to high frequency communication systems is concerned. To achieve a given amount of cancellation in the transmitter amplifiers one is forced to cancel the distortion products over the entire frequency band, but the receiving sensitivity is only affected by the distortion products in the frequency band to which the receiver is presently tuned.

SUMMARY OF THE INVENTION

Accordingly, it is an object of the present invention to reduce the distortion generated by a device such as an amplifier.

Another object is to reduce the bandwidth of distortion cancellation in a feed-forward system to enhance its cancellation performance.

A further object is to reduce interference between communication transmitters and receivers so that they need not be spaced far apart.

These and other objects of the present invention are achieved by a feed-forward system for reducing the distortion generated by a device such as an amplifier. The system includes a feed-forward channel employing a sampling means which extracts a sample of the distortion products from the output of the device in a frequency band whose bandwidth is less than that of the device, and an equalizing means which equalizes the sample and the products remaining in the output of the device in the frequency band after extracting the sample. The equalized sample and the remaining products are subtractively combined in a combining means to produce a system output in which distortion in the frequency band is reduced. The feed-forward system improves the performance of conventional feed-forward cancelling systems by reducing the bandwidth over which distortion cancellation takes place and thereby enhances cancellation performance.

Additional advantages and features will become apparent as the subject invention becomes better understood by reference to the following detailed description when considered in connection with the accompanying drawings, wherein:

DESCRIPTION OF THE PREFERRED EMBODIMENTS

Figure 1:
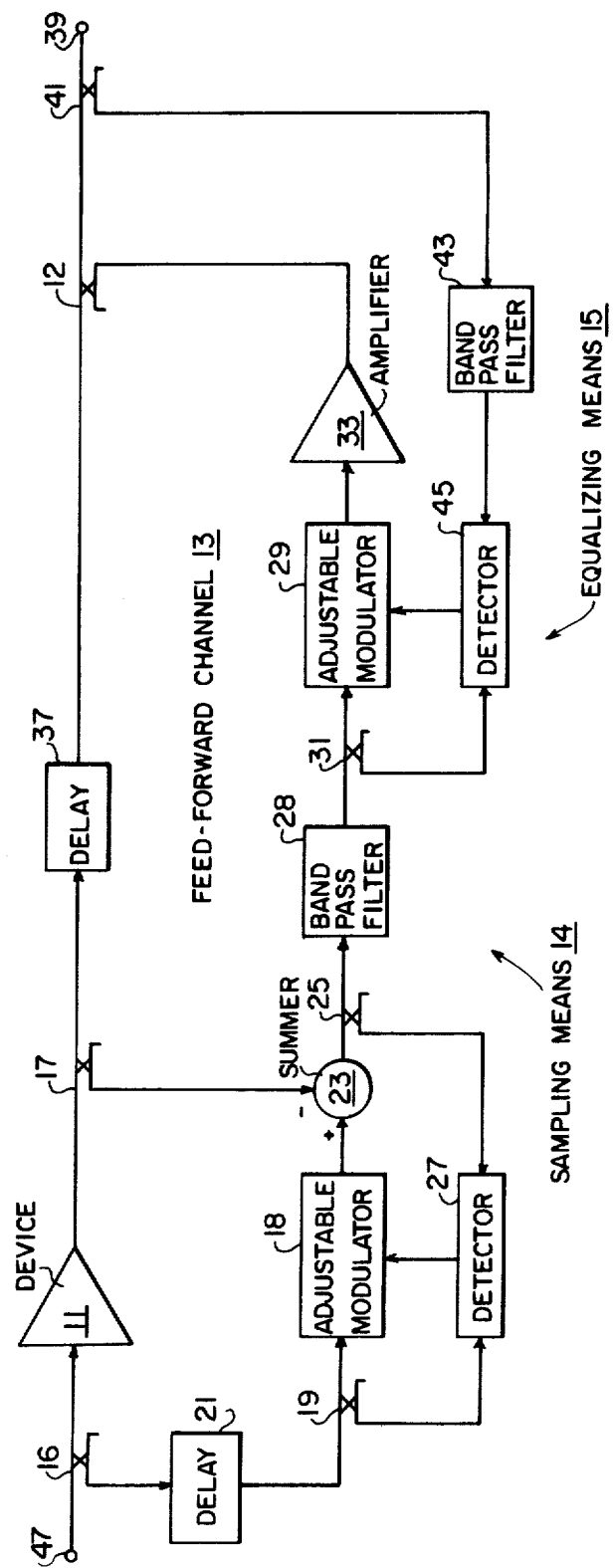
FIG. 1 is a block schematic diagram of a first embodiment of the feed-forward system according to the invention.

Referring now to the drawings wherein like characters refer to like or corresponding parts, FIG. 1 illustrates an embodiment of a feed-forward system for reducing the distortion generated by a device 11, such as an amplifier.

The feed-forward system includes a combining means 12 to which the output of the device 11 is connected as one input and the output of a feed-forward channel 13 is connected as the other input.

The feed-forward channel 13 includes a sampling means 14 which extracts from the output of the device 11 a sample of the distortion products generated by the device in a frequency band whose bandwidth is less than that of the device; and an equalizing means 15 which equalizes the sample and the products remaining in the output of the device in the frequency band after extracting the sample. The combining means 12 subtractively combines the equalized sample and the remaining products to produce a system output in which distortion in the frequency band is reduced.

While the sampling means 14 may take a variety of forms, conveniently it may take the form illustrated in FIG. 1 of a coupler 16 connected in series with the input of the device 11; a coupler 17 connected in series with the output of the device; an adjustable amplitude-and-phase modulator 18 connected to the auxiliary output port of the coupler 16 by way of another coupler 19 and a time delay 21; a summer 23 whose inputs are connected respectively to the output of the amplitude-and-phase modulator 18 and to the auxiliary output port of the coupler 17; a coupler 25 connected in series with the output of the summer 23; a synchronous detector 27 having a signal input connected to the auxiliary output port of the coupler 25, a reference input connected to the auxiliary output port of the coupler 19, and its output connected to the control input of the modulator 18, and a bandpass filter 28 connected to the main output port of the coupler 25.

The couplers shown in the drawing are directional couplers having a main input port, a main output port, an auxiliary port, and a terminated port which is terminated in a load equal to the characteristic impedance of the coupler. When the coupler is used as a signal sampler, a fraction of the power flowing from the main input port to the main output port is extracted from the auxiliary port in proportion to its coupling factor. When the coupler is used as a signal injector, power is applied to the auxiliary port to cancel power flowing from the main input port to the main output port. In both instances, power flowing from the main output port to the main input port also couples to the auxiliary port but is attenuated, usually significantly, by the directional characteristics of the coupler. Regardless of how the coupler is used, assuming it is lossless, the power entering the coupler equals the power leaving the coupler. The convention will be adopted herein of referring to the auxiliary port as the auxiliary output port when the coupler is used as a signal sampler, and as the auxiliary input port when the coupler is used as a signal injector.

Amplitude-and-phase modulators, and synchronous detectors are well known to those skilled in the art, suitable modulators and detectors being disclosed, for example, in section 3 of Technical Report RADC-TR-77-270 (August 1977) to Rome Air Development Center, entitled "High Power Controller and ICS" publicly available from the National Technical Information Service.

The combining means 12 may comprise, for example, a coupler whose main input port is connected to the main output port of the coupler 17 by way of a time delay 37, and whose main output port is connected to the system output terminal 39.

While the equalizing means 15 may take a variety of forms, conveniently it may take the form illustated in FIG. 1 of an adjustable amplitude-and-phase modulator 29 whose input is connected to the output of the bandpass filter 28 by way of another coupler 31, a subsidiary amplifier 33 connected between the output of the modulator 29 and the auxiliary input port of the coupler 12, a coupler 41 connected in series with the main output port of the coupler 12, a bandpass filter 43 whose input is connected to the auxiliary output port of the coupler 41, and a synchronous detector 45 having a signal input connected to the output of the bandpass filter 43, a reference input connected to the auxiliary output port of the coupler 31, and its output connected to the control input of the modulator 29.

The time delay introduced by delay 37 is such that signals fed to the coupler 12 from the output of the device 11 by way of the path including coupler 17 and time delay 37 or by way of the path including coupler 17, summer 23, coupler 25, bandpass filter 28, coupler 31, modulator 29, and subsidiary amplifier 33, each appear at the input ports of coupler 21 in time coincidence. The time delay introduced by delay 21 is such that signals fed to the summer 23 from input terminal 47 by way of the path 18 or by way of the path including coupler 16, device 11, and coupler 17, each appear at the input terminals of summer 23 in time coincidence.

In operation of the system shown in FIG. 1, a sample of the device input signal is extracted by the coupler 16, and a sample of the device output signal is extracted by the coupler 17. The device output signal contains a fundamental component (replica of the input signal) at power level S, and a distortion component at power level D; that is to say, the device output contains a fundamental component and a distortion component in the ratio S/D. The sample of the device input signal is fed from the auxiliary output port of the coupler 16 by way of the delay 21 and the coupler 19 to the adjustable amplitude-and-phase modulator 18 which equalizes the sample of the device input signal and its replica in the sample of the device output. A portion of the sample of the device input signal is extracted by the coupler 19 and fed from its auxiliary output port to the reference input of the synchronous detector 27. The output of the modulator 18 and the output of the auxiliary output port of the coupler 17 are fed to the summer 23 which subtractively combines the equalized sample of the device input signal and the extracted sample of the device output signal to produce a distortion products sample. The summer 23 rejects the fundamental component in the sample of the device output signal relative to the distortion component by the power ratio $R_1$, so that the distortion products sample contains these components in the ratio $S/DR_1$.

A portion of the distortion products sample is extracted by the coupler 25 and fed from its auxiliary output port to the signal input of the synchronous detector 27. The detector 27 correlates the extracted portion of the distortion products sample with the sample of the device input signal and adjusts the modulator 18 to minimize the correlation. The distortion products sample is fed to the bandpass filter 28 which attenuates frequencies in the distortion products sample that lie outside the frequency band in which the distortion is to be reduced, to produce a sample of the distortion products in the frequency band. Since the small fundamental component in the distortion products sample generally includes frequencies which lie outside the frequency band, it will be attenuated to a greater extent than the distortion component. That is, the band pass filter 28 rejects the fundamental component in the distortion products sample relative to the distortion component by the power ratio $F_1$, so that the sample of the distortion products in the frequency band now contains these components in the ratio $S/(DR_1F_1)$. The sample of the distortion products in the frequency band is fed from the bandpass filter 28 by way of the coupler 31 to the adjustable amplitude-and-phase modulator 29 and the subsidiary amplifier 33 which equalize the sample and the distortion products remaining in the output of the device in the frequency band after extracting the sample. A portion of the distortion products sample is extracted by the coupler 31 and fed from its auxiliary output port to the reference input of the synchronous detector 45. This sample at the reference input of the detector 45 contains the distortion and fundamental components in the ratio $(DR_1F_1)/S$. The output of the subsidiary amplifier 33 is fed to the auxiliary input port of the coupler 12 and the output of the main port of the coupler 15 is fed by way of the delay 37 to the main input port of the coupler 12 which subtractively combines the equalized sample and the remaining products and feeds the result by way of the coupler 41 to the output terminal 39 as a distortion-reduced system output. The coupler 12 rejects the distortion component in the portion of the device output signal lying in the frequency band in which the distortion is to be reduced relative to the fundamental component by the power ratio $R_2$ so that the portion of the system output contains these components in the ratio $(SR_2)/D$.

A sample of the distortion-reduced system output is extracted by the coupler 41 and fed from its auxiliary output port to the band pass filter 43 which attenuates frequencies in the sample of the system output that lie outside the frequency band to produce a sample of the system output in the frequency band. Since the large fundamental component in the system output sample generally includes frequencies which lie outside the frequency band, it will be attenuated to a greater extent than the distortion component. That is, the band pass filter 43 rejects the fundamental component in the system ouput sample relative to the distortion component by the power ratio $F_2$ so that the sample of the system output in the frequency band contains these components in the ratio $(SR_2)/(DF_2)$. The latter sample is fed from the band pass filter 43 to the signal input of the synchronous detector 45. The synchronous detector 45 correlates the sample of the system ouput in the frequency band, which sample contains the fundamental and distortion components in the ratio $(SR_2)/(DF_2)$ with the sample of the distortion products in the frequency band, which sample contains the fundamental and distortion components in the ratio $S/(DR_1F_1)$, and adjusts the modulator 29 to minimize the correlation. Both the fundamental components and the distortion components contribute to the correlation, so that the detector 45 adjusts the modulator 29 to equalize these two correlation components. The equality of their magnitudes implies that the product of the fundamental components in the two detector inputs equals the product of the distortion components in the two detector inputs. This in turn implies that the ratio of the fundamental and distortion components in the system output sample times the ratio of the fundamental and distortion components in the distortion products sample equals unity, or $$(SR_2/DF_2)(S/DR_1F_1)=1,$$

from which it follows that the power ratio by which the distortion component in the portion of the device output signal lying in the frequency band in which the distortion is to be reduced is rejected relative to the fundamental component $$R_2=D^2R_1F_1F_2S^2.$$

The ratio $R_2$ is enhanced by a factor $F_1F_2$ over the ratio associated with the prior art feed-forward system so that the present invention wherein cancellation is limited to a desired frequency band whose bandwidth is less than that of the device provides a substantial improvement in distortion cancellation.

Figure 2:
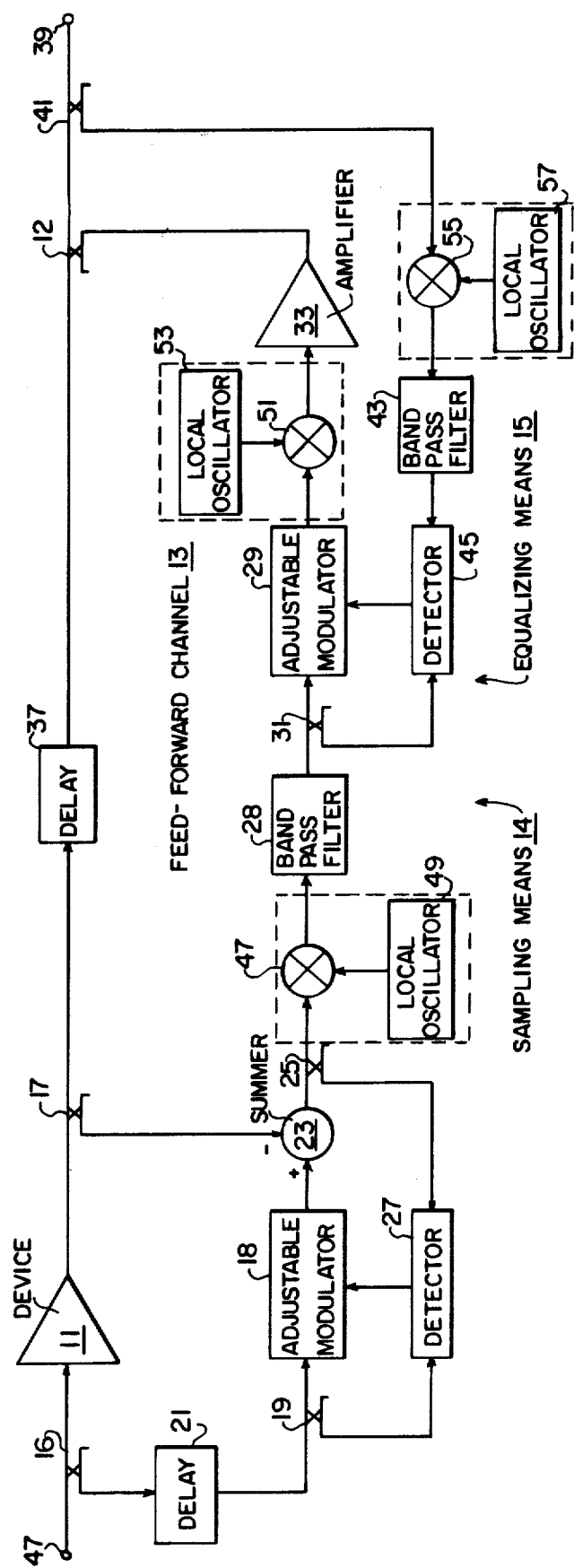
FIG. 2 is a block schematic diagram of a second embodiment of the feed-forward system according to the invention.

FIG. 2 illustrates a modification of the system shown in FIG. 1. The system of FIG. 2 differs from that of FIG. 1 in the addition of means for varying the location in the frequency spectrum of the frequency band to which the cancellation is limited to permit use of the feed-forward system in a communication system where the receiver frequency is constantly changing. While the varying means may take a variety of forms, conveniently it may take the form illustrated in FIG. 2 of a mixer 47 connected between the main output port of the coupler 25 an the input of the bandpass filter 28 and fed by a frequency-variable local oscillator 49; a mixer 51 connected between the output of the modulator 29 and the input of the subsidiary amplifier 33 and fed by a frequency-variable local oscillator 53, and a mixer 55 connected between the auxiliary output port of the coupler 41 and the input of the bandpass filter 43 and fed by a frequency-variable local oscillator 57.

The operation of the system of FIG. 2 is the same as that of FIG. 1 except that the mixer 47 translates the set of frequencies in the distortion products sample to a new set of frequencies offset from the old set of frequencies. The frequency-variable local oscillator 49 provides the frequency offset. Variation of the frequency offset, by varying the frequency of the local oscillator 49, shifts the location in the frequency spectrum of the frequency band that is translated to the passband of the bandpass filter 28 and whose distortion content is to be reduced. The mixer 51 translates the set of frequencies in the equalized sample back to the old set of frequencies. The mixer 55 translates the set of frequencies in the distortion-reduced system ouput sample to the new set of frequencies. The local oscillators 53 and 55 are ganged with the local oscillator 49 to provide the same frequency offset.

Figure 3:
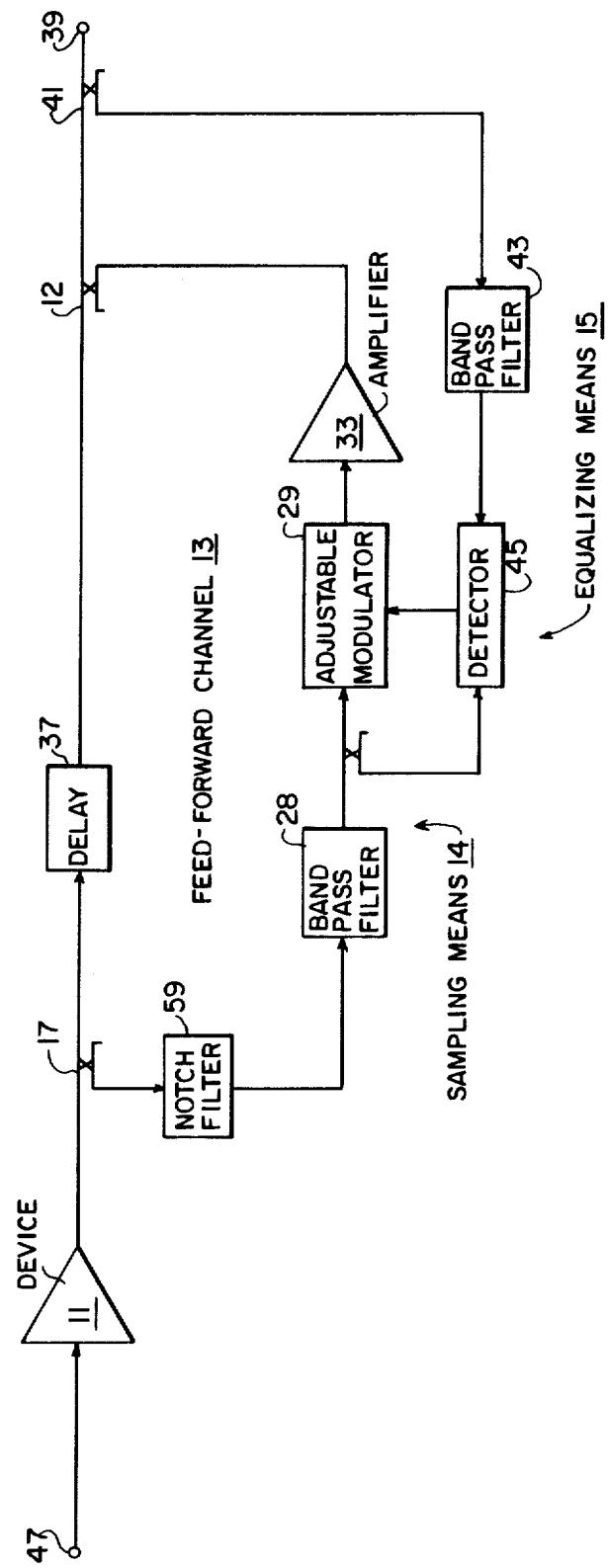
FIG. 3 is a block schematic diagram of a third embodiment of the feed-forward system according to the invention.

FIG. 3 illustrates another modification of the system shown in FIG. 1. The system of FIG. 3 differs from that of FIG. 1 in the substitution for all of the elements of the first sampling means 14 except for the coupler 17 and bandpass filter 28, of a notch filter 59 having notches at the frequencies of the fundamental component of the device ouput signal. The notch filter 59 is connected between the auxiliary output port of the coupler 17 and the bandpass filter 28. The notch filter 59 rejects the signal component in the sample of the device output signal relative to the distortion component by the power ratio $R_1$ so that the reference input to the detector 45 contains these components in the ratio $DR_1/S$. The operation of the remainder of the system is the same as that of FIG. 1.

Figure 4:
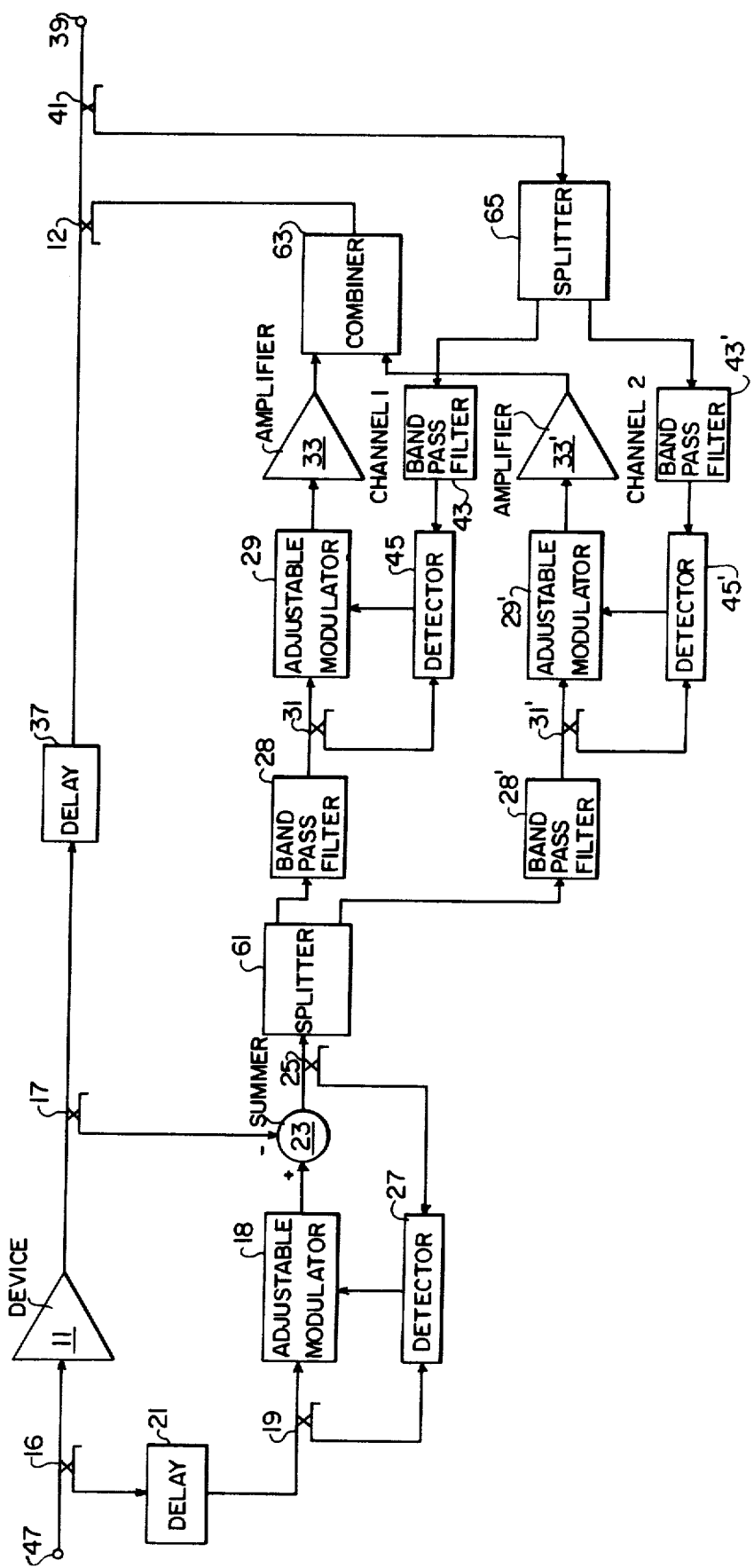
FIG. 4 is a block schematic diagram of a fourth embodiment of the feed-forward system according to the invention.
Figure 5:
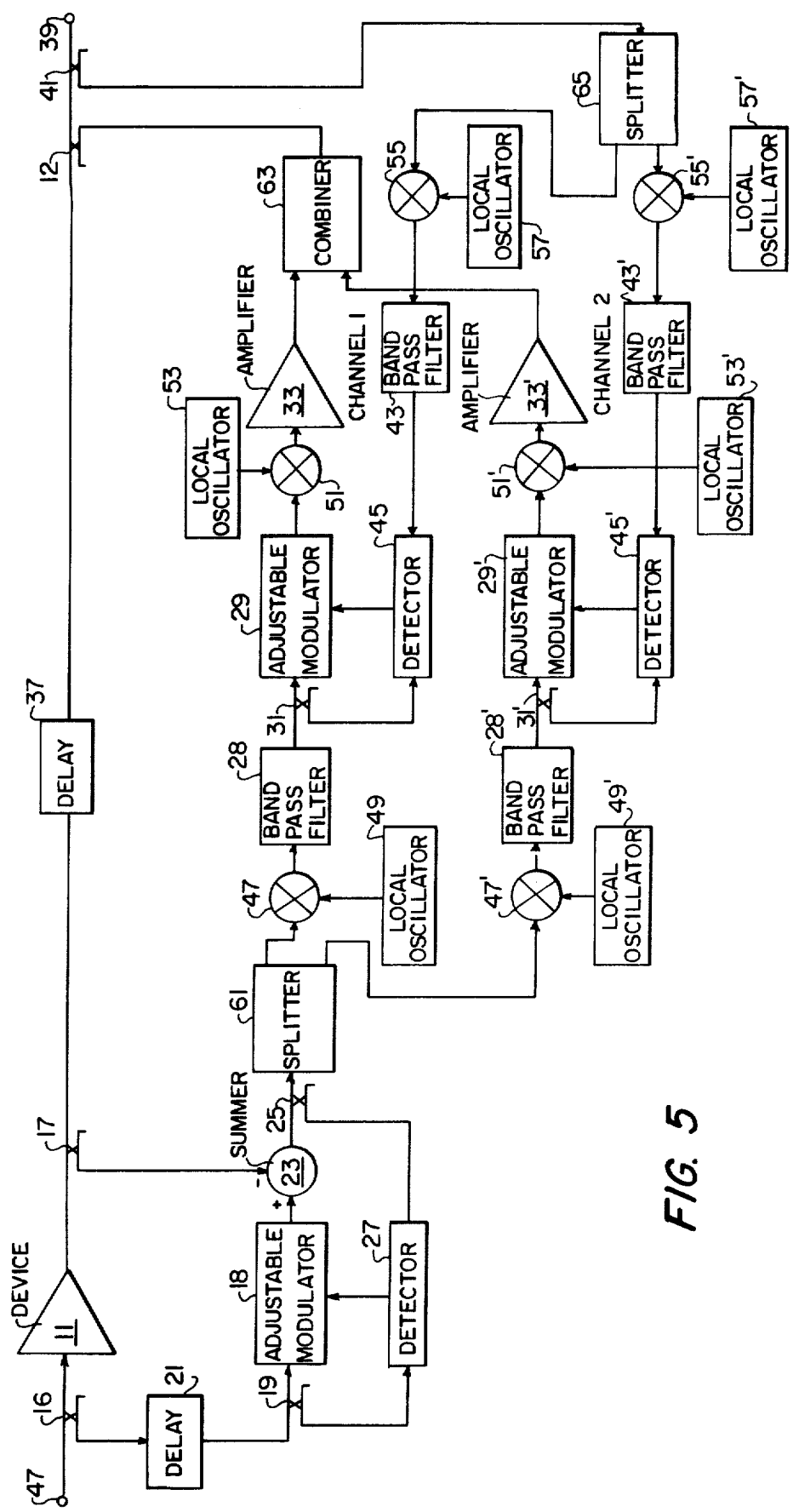
FIG. 5 is a block schematic diagram of a fifth embodiment of the feed-forward system according to the invention.
Figure 6:
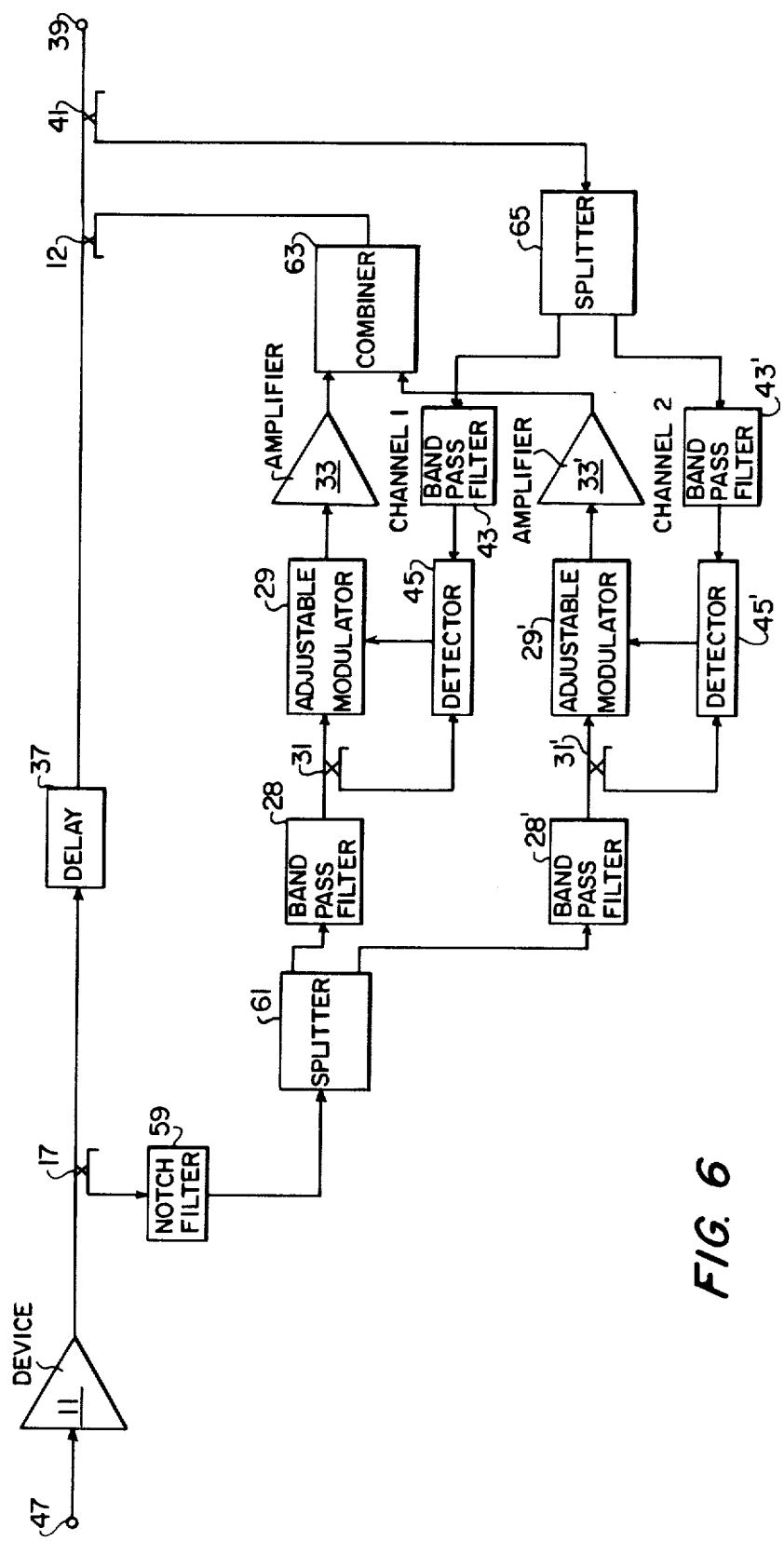
FIG. 6 is a block schematic diagram of a sixth embodiment of the feed-forward system according to the invention.

The foregoing description has been made by reference to an example where cancellation is limited to a single frequency band whose bandwidth is less than that of the device 11. It is to be understood, however, that the inventive concept can easily be extended to the case where cancellation is effected in a plurality of separated frequency bands whose bandwidths is less than that of the device 11. Such might be the case where the feed-forward system is used in a communication system having several receivers that are tuned to different frequencies. Reference is made to FIGS. 4, 5 and 6 illustrating modifications of the system of FIG. 1 wherein a plurality of feed-forward channels, each including a set of bandpass filters characterized by a respective passband, has been substituted for the single feed-forward channel shown in FIGS. 1, 2 and 3, and a power splitter 61 and a power combiner 63 have been provided respectively to split the distortion product sample into a plurality of samples and to combine the equalized samples. Likewise, a power splitter 65 has been provided to split the distortion-reduced system output sample among the detectors 45, 45' of the plurality of feed-forward channels. Whereas FIGS. 4, 5 and 6 show only two feed-forward channels, they may easily be extended to a plurality of channels. FIGS. 4, 5 and 6 are largely self-explanatory from the figures themselves since the same reference numerals (apart from a prime) have been used as in FIGS. 1, 2 and 3 for circuits having identical functions.

In general, any distortion produced by a device that would otherwise interfere with either collocated or remote receivers or sensors, in which the bandwidths of all the receivers or sensors is less than that of the device, can be more effectively reduced by the invention than by previous art which requires full bandwidth cancellation.

Obviously, numerous other modifications and variations of the present invention are possible in light of the above teachings. For example, the action of the modulator 18 could be eliminated—its function instead could be absorbed by bandpass filters 28 and 43. Thus, where a distortion rejection ratio of 10 log $R_2 = 30$ dB is required for a device 11 having a (D/S) dB ratio of $-30$ dB, 10 log $R_1$ could be set to 0 db, and 10 log $F_1 = 10$ log $F_2 = 45$ dB would satisfy the requirement. However, the modulator 18 will usually be retained for other reasons; namely to preclude an intermodulation problem that could otherwise arise in the components that follow the summer 23. It is therefore to be understood that within the scope of the claims, the invention may be practiced otherwise than as specifically described herein.

What is claimed as new and desired to be secured by Letters Patent of the United States is:

1. A feed-forward system for reducing the distortion generated by a device such as an amplifier, the feed-forward system comprising:
   a feed-forward channel including,
      sampling means adapted to be connected to the device for extracting a sample of the distortion products from the output of the device in a frequency band whose bandwidth is less than that of the device; and
      equalizing means connected to the sampling means for equalizing the sample and the products remaining in the output of the device in the frequency band after extracting the sample; and
      combining means connected to the equalizing means and adapted to be connected to the device for subtractively combining the equalized sample and the remaining products to produce a system output in which distortion in the frequency band is reduced.

2. The feed-forward system recited in claim 1 wherein the sampling means includes:
   a first coupler for extracting a sample of the device input signal, the first coupler having a main output port adapted to be connected to the device input, and an auxiliary output port;
   a second coupler for extracting a sample of the device output signal, the second coupler having an input port adapted to be connected to the device output, and an auxiliary output port;
   a third coupler having an input port connected to the auxiliary output port of the first coupler, and auxiliary and main output ports;
   an adjustable amplitude-and-phase modulator for equalizing the sample of the device input signal and its replica in the sample of the device output, the modulator connected to the main output port of the third coupler and having a control input;
   a summer for subtractively combining the equalized sample of the device input signal and the extracted sample of the device output signal to produce a distortion products sample, the summer having inputs connected respectively to the output of the amplitude-and-phase modulator and to the auxiliary output port of the second coupler;
   a fourth coupler for extracting a portion of the distortion products sample, the fourth coupler having an input connected to the output of the summer, and an auxiliary output port;
   a synchronous detector for correlating the sample of the device input signal with the extracted portion of the distortion products sample and adjusting the modulator to minimize the correlation result, the detector having a signal input connected to the auxiliary output port of the fourth coupler, a reference input connected to the auxiliary output port of the third coupler, and an output connected to the control input of the modulator; and
   a bandpass filter for attenuating frequencies in the distortion products sample that lie outside the frequency band, the bandpass filter connected to the main output port of the fourth coupler.

3. The feed-forward system recited in claim 1 wherein the sampling means includes:
   a coupler for extracting a sample of the device output, the coupler having an input port adapted to be connected to the device output, and an auxiliary output port;
   a notch filter having notches at the frequencies of the fundamental component in the device output signal for rejecting the fundamental component in the device output, the notch filter connected to the auxiliary output port of the coupler; and
   a bandpass filter for attenuating frequencies in the distortion products sample that lie outside the frequency band, the bandpass filter connected to the main output port of the fourth coupler.

4. The feed-forward system recited in claim 1 wherein the equalizing means includes:
   an adjustable amplitude-and-phase modulator having an input connected to the sampling means;
   a subsidiary amplifier connected between the output of the modulator and the combining means;
   a coupler having an auxiliary output port, and an input connected to the combining means for extracting a sample of the distortion-reduced system output;
   a bandpass filter for attenuating frequencies in the sample of the system output that lie outside the frequency band, the bandpass filter connected to the auxiliary output port of the coupler; and a synchronous detector having a signal input connected to the bandpass filter, a reference input connected to the sampling means, and an output connected to the modulator.

5. The feed-forward system recited in claim 1 including:
means for varying the location in the frequency spectrum of the frequency band.

6. The feed-forward system recited in claim 2 including:
a mixer connected between the main output port of the fourth coupler and the input of the bandpass filter for translating the set of frequencies in the distortion product sample to a new set of frequencies offset from the old set of frequencies.

7. The feed-forward system recited in claim 6 including:
a frequency-variable local oscillator connected to the mixer for varying the frequency offset to shift the location of the frequencies translated to the pass band of the bandpass filter.

8. The feed-forward system recited in claim 4 including:
a mixer connected between the output of the modulator and the input of the subsidiary amplifier.

9. The feed-forward system recited in claim 4 including:
a mixer connected between the auxiliary output port of the coupler and the input of the bandpass filter.

10. A method of reducing the distortion generated by a device such as an amplifier comprising the steps of:
extracting a sample of the distortion products from the output of the device in at least one frequency band whose bandwidth is less than that of the device;
equalizing the sample and the products remaining in the output of the device in the frequency band after extracting the sample; and
subtractively combining the equalized sample and the remaining products to produce a system output in which distortion in the frequency band is reduced.

11. The feed-forward system recited in claim 1 wherein the sampling means includes:
a first coupler for extracting a sample of the device input signal, the first coupler having a main output port adapted to be connected to the device input, and an auxiliary output port.

12. The feed-forward system recited in claim 11 wherein the sampling means includes:
a second coupler for extracting a sample of the device output signal, the second coupler having an input port adapted to be connected to the device output, and an auxiliary output port.

13. The feed-forward system recited in claim 12 wherein the sampling means includes:
a third coupler having an input port connected to the auxiliary output port of the first coupler, and auxiliary and main output ports.

14. The feed-forward system recited in claim 13 wherein the sampling means includes:
an adjustable amplitude-and-phase modulator for equalizing the sample of the device input signal and its replica in the sample of the device output, the modulator connected to the main output port of the third coupler and having a control input.

15. The feed-forward system recited in claim 14 wherein the sampling means includes:
a summer for subtractively combining the equalized sample of the device input signal and the extracted sample of the device output signal to produce a distortion products sample, the summer having inputs connected respectively to the output of the amplitude-and-phase modulator and to the auxiliary output port of the second coupler.

16. The feed-forward system recited in claim 15 wherein the sampling means includes:
a fourth coupler for extracting a portion of the distortion products sample, the fourth coupler having an input connected to the output of the summer, and an auxiliary output port.

17. The feed-forward system recited in claim 16 wherein the sampling means includes:
a synchronous detector for correlating the sample of the device input signal with the extracted portion of the distortion products sample and adjusting the modulator to minimize the correlation result, the detector having a signal input connected to the auxiliary output port of the fourth coupler, a reference input connected to the auxiliary output port of the third coupler, and an output connected to the control input of the modulator.

18. The feed-forward system recited in claim 1 wherein the sampling means includes:
a coupler for extracting a sample of the device output, the coupler having an input port adapted to be connected to the device output, and an auxiliary output port.

19. The feed-forward system recited in claim 18 wherein the sampling means includes:
a notch filter having notches at the frequencies of the fundamental component in the device output signal for rejecting the fundamental component in the device output, the notch filter connected to the auxiliary output port of the coupler.

20. The feed-forward system recited in claim 1 wherein the equalizing means includes:
an adjustable amplitude-and-phase modulator having an input connected to the sampling means.

21. The feed-forward system recited in claim 20 wherein the equalizing means includes:
a subsidiary amplifier connected between the output of the modulator and the combining means.

22. The feed-forward system recited in claim 21 wherein the equalizing means includes:
a coupler having an auxiliary output port, and an input connected to the combining means for extracting a sample of the distortion-reduced system output.

23. The feed-forward system recited in claim 22 wherein the equalizing means includes:
a bandpass filter for attenuating frequencies in the sample of the system output that lie outside the frequency band, the bandpass filter connected to the auxiliary output port of the coupler.

* * * * *